Figure 1:
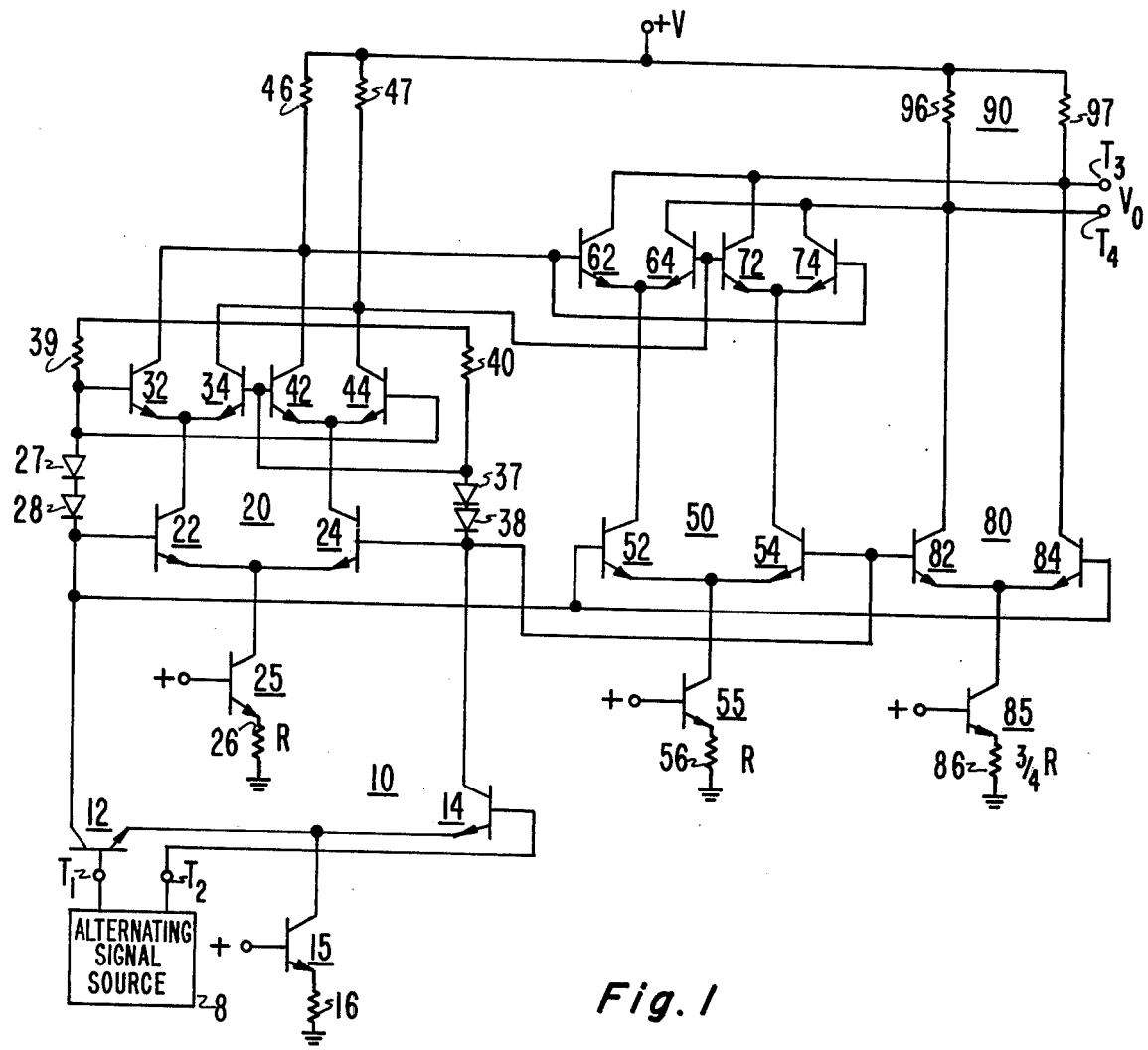

United States Patent [19]

Harwood

[11] 4,019,118
[45] Apr. 19, 1977

[54] THIRD HARMONIC SIGNAL GENERATOR

[75] Inventor: Leopold Albert Harwood, Somerville, N.J.

[73] Assignee: RCA Corporation, New York, N.Y.

[22] Filed: Mar. 29, 1976

[21] Appl. No.: 671,563

[52] U.S. Cl. .................................. 321/65; 328/16; 328/144; 330/30 D; 331/76
[51] Int. Cl.² ...................................... H02M 5/16
[58] Field of Search ............. 321/60, 65, 66, 69 R; 330/30 D; 331/53, 76; 328/16, 17, 18, 144; 235/193.5, 194; 307/229

[56] References Cited
UNITED STATES PATENTS

| | | | |
|---|---|---|---|
| 3,566,247 | 2/1971 | Golembeski | 321/60 |
| 3,828,268 | 8/1974 | Nishio | 330/30 D |
| 3,838,262 | 9/1974 | van de Plassche | 307/229 |
| 3,922,614 | 11/1975 | van de Plassche | 330/30 D |
| 3,974,460 | 8/1976 | Hongu et al. | 331/76 |

*Primary Examiner*—Gerald Goldberg
*Attorney, Agent, or Firm*—Eugene M. Whitacre; Ronald H. Kurdyla

[57] ABSTRACT

An integratable third harmonic signal generator includes a signal multiplier coupled to a source of alternating input signal, for providing a first output signal proportional to the input signal raised to the third power. The first output signal includes a first harmonic component and a third harmonic component each proportional to the input signal. Means are also included for deriving, from the input signal, a second output signal in predetermined magnitude and polarity relation with the first harmonic component. The first and second output signals are combined to cancel the first harmonic component and thereby provide a third output signal proportional to the third harmonic component of the input signal substantially devoid of any first harmonic component.

16 Claims, 2 Drawing Figures

THIRD HARMONIC SIGNAL GENERATOR

This invention relates to signal generator circuits and, more particularly, to third harmonic signal generator circuits particularly adapted to integrated circuit techniques.

Third harmonic signals are needed in a variety of electrical circuit applications. For example, such signals can be used as switching or clock signals for an active delay line in a luminance or a chrominance signal processing channel of a color television receiver. The active luminance delay line serves to provide, among other functions, matching of a video signal transit time of the luminance channel with a signal transit time, or delay, which is typically observed for a chrominance signal processing channel of the receiver. The luminance or chrominance delay lines may also be used in "comb filtering" applications. An array of charge coupled devices (CCD's) can be used to form such delay lines. Such devices desirably utilize an input switching or clock signal which is two to three times the highest signal frequency. One advantageous clock frequency is the third harmonic of the chrominance subcarrier component of the video signal (e.g., 10.7 MHz clock frequency where the chrominance subcarrier is 3.58 MHz).

In general, a third harmonic signal employed for this or other purposes should be free of fundamental and other harmonics so as to avoid contaminating the processed signal (which may include signal components at, for example, such fundamental frequency) with the clocking components. Tuned circuits for developing the third harmonic signal preferably are avoided, as tuned circuits undesirably add to circuit size, cost and complexity. Arrangements which employ tuned circuits may render the integration of the third harmonic signal generator impractical because of the limited surface area of an integrated circuit chip and because of the limited number of terminals which are available for connection to external circuit components.

Accordingly, a third harmonic signal generator in accordance with the present invention comprises a signal multiplier coupled to a source of alternating input signals for providing a first output signal proportional to the input signal raised to the third power. The first output signal includes a first harmonic component proportional to the input signal, and a third harmonic component proportional to the input signal. Means responsive to the input signal provide a second output signal in predetermined magnitude and polarity relation with the first harmonic component. A combining network combines the first and second output signals to cancel the first harmonic component and thereby provide a third output signal proportional to the third harmonic component and substantially devoid of first harmonic components.

Figure 2:
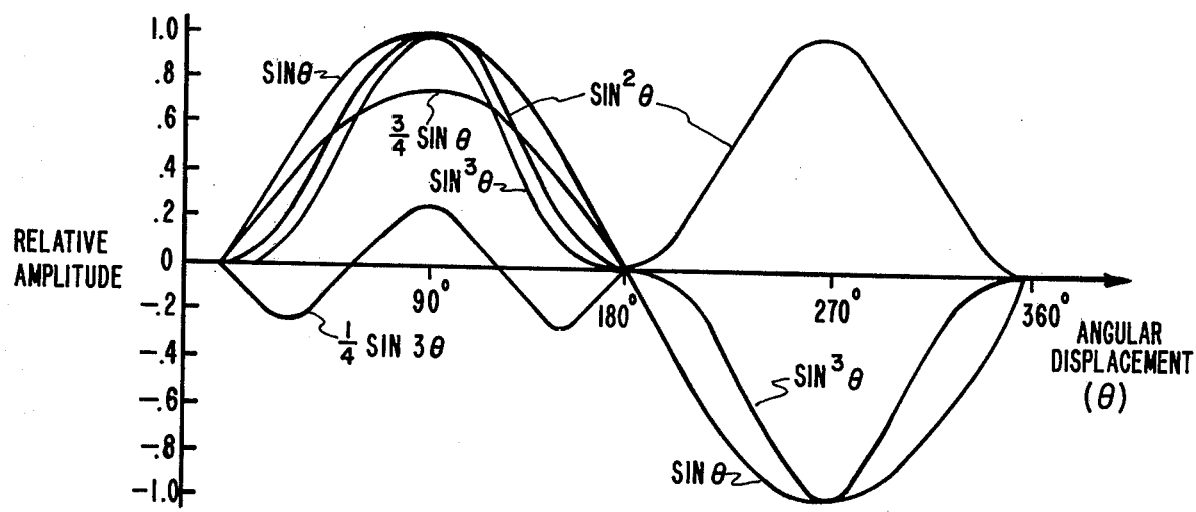

In the drawing:

FIG. 1 illustrates a third harmonic signal generator circuit constructed according to the present invention; and FIG. 2 illustrates signal waveforms associated with the operation of the signal generator circuit.

Referring to FIG. 1, the generator comprises a first doubly balanced signal multiplier 20, a second doubly balanced signal multiplier 50, a signal proportioning circuit 80 and an output signal combining network 90.

A pair of input terminals $T_1$ and $T_2$ couple an alternating input signal A sinωt (hereinafter referred to as A sin $\theta$) from a signal source 8 to input base electrodes of a pair of differentially connected transistors 12 and 14. Transistors 12 and 14 together with a current source transistor 15 and a resistor 16 form an input signal amplifier 10.

Signals from collector outputs of transistors 12 and 14 are respectively coupled to base inputs of a first pair of differentially connected transistors 22 and 24 of the first signal multiplier 20. Multiplier 20 also includes second and third upper pairs of emitter coupled transistors 32, 34 and 42, 44 arranged in differential amplifier configuration. The interconnected emitters of transistors 32, 34 and 42, 44 represent a first signal input of multiplier 20 and are respectively coupled to the collector outputs of transistors 22 and 24.

Base input electrodes of transistors 32 and 44 are interconnected and coupled in common to the collector output of transistor 12 via a pair of series connected bias compensation diodes 27 and 28. Similarly, base input electrodes of transistors 34 and 42 are interconnected and coupled in common to the collector output of transistor 14 via a pair of series connected bias compensation diodes 37 and 38. The interconnected base electrodes of transistors 32, 44 and 34, 42 represent a second signal input of multiplier 20.

A pair of equal value series bias resistors 39 and 40 are connected between the interconnected base electrodes of transistors 32, 44 and the interconnected base electrodes of transistors 34, 42. A current source including a transistor 25 and a gain proportioning resistor 26 of nominal value R serves as an operating current supply for multiplier 20. Output signals of multiplier 20 appear at interconnected collectors of transistors 32, 42 and 34, 44 and are developed across a pair of output load resistors 46 and 47 of substantially equal value.

Second signal multiplier 50 is similar to first signal multiplier 20 and includes first, second and third emitter coupled transistor pairs 52, 54; 62, 64; and 72, 74 each arranged in differential amplifier configuration. A current source transistor 55 and a gain proportioning resistor 56 of a value R equal to that of resistor 26 serve as an operating current supply for multiplier 50. Base input electrodes of transistors 52 and 54 are respectively coupled to collector output electrodes of transistors 12 and 14 of amplifier 10. Interconnected emitter input electrodes of upper transistor pairs 62, 64 and 72, 74 are coupled to collector output electrodes of transistors 52 and 54, respectively, and represent a first signal input of multiplier 50. Base input electrodes of transistors 62 and 74 are interconnected and coupled in common to the joined collector outputs of transistors 32 and 42 of first signal multiplier 20. Base input electrodes of transistors 64 and 72 are interconnected and coupled in common to the joined collector outputs of transistors 34 and 44 of multiplier 20. The interconnected base electrodes of transistors 62, 74 and 64, 72 represent a second signal input of multiplier 50. Output signals of multiplier 50 appear at interconnected collectors of transistors 62, 72 and at interconnected collectors of transistors 62, 72 and 64, 74.

Signal proportioning circuit 80 includes a pair of emitter coupled transistors 82 and 84 arranged in differential amplifier configuration, and a current source comprising a transistor 85 and a gain proportioning resistor 86 of a value substantially equal to ¾ R. Base input electrodes of transistors 82 and 84 are respectively connected to the collector outputs of transistors 14 and 12 of amplifier 10. Collector outputs of transistors 82 and 84 are respectively coupled to the joined collector outputs of transistors 64, 74 and 62, 72 of second signal multiplier 50.

Combining network 90 includes a resistor 96 for combining the signals appearing at the collector outputs of transistors 64, 74 and 82, and a resistor 97 for combining the signals appearing at the collector outputs of transistors 62, 72 and 84. In the illustrated arrangement, resistors 96 and 97 are of equal value and are equal to the values of resistors 46 and 47. Combined output signals appear at a pair of output terminals $T_3$ and $T_4$. The combined output signals are proportional to the third harmonic of the input signal and are developed as follows.

In operation, an alternating input signal $A \sin \theta$ is applied in push-pull relationship to input terminals $T_1$ and $T_2$. Push-pull, amplified signals are applied from the collectors of transistors 12 and 14 to the base inputs of transistors 22 and 24. Signals provided at the collectors of transistors 22 and 24 are applied to the joined emitters of transistors 32, 34 and 42, 44 corresponding to the first pair of signal inputs of multiplier 20. Push-pull signals from the collectors of transistors 12 and 14 are also applied to the interconnected base electrodes of transistors 32, 44 and 34, 42, corresponding to the second pair of signal inputs of multiplier 20.

Signal multiplier 20 operates, as is known, to provide the product of the signals applied to the first and second pairs of signal inputs. For example, considering the signal path including the collector-emitter current path of transistors 32 and 22, the collector signal current of transistor 22 is proportional to a signal voltage of the form $-A' \sin \theta$ appearing at the base of transistor 22, and the collector signal current of transistor 32 is proportional to the product of the signal voltage $-A' \sin \theta$ appearing at the base of transistor 22 and a signal voltage of the form $-A'' \sin \theta$ appearing at the base of transistor 32. In this case, the magnitudes of the latter two signal voltages $A'$ and $A''$ are substantially equal. Thus multiplier 20 provides an output signal proportional to $\sin^2 \theta$, which appears at the joined collectors of transistors 32, 42 and 34, 44 in push-pull or antiphase relation. The magnitude of output signal $\sin^2 \theta$ is related to the gain of multiplier 20, which in turn is related to the value R of resistor 26 and the values of resistors 46 and 47.

Push-pull amplified input signals from the collectors of transistors 12 and 14 of amplifier 10 also are applied to the base inputs of transistors 52 and 54 of second signal multiplier 50. Transistors 52 and 54 provide push-pull signals proportionals to $\sin \theta$ at respective collector outputs. The signals appearing at the collectors of transistors 52 and 54 are applied to the joined emitters of transistors 62, 64 and 72, 74, corresponding to the first pair of signal inputs of multiplier 50. The push-pull output signals (proportional to $\sin^2 \theta$) of the first signal multiplier 20 are applied to the second pair of signal inputs of multiplier 50, comprising the interconnected base electrodes of transistors 62, 74 and 64, 72.

Multiplier 50 also operates in known fashion to provide the product of the signals applied thereto. Thus multiplier 50 provides an output signal proportional to $\sin^3 \theta$ (i.e., proportional to the product of input signals proportional to $\sin \theta$ and $\sin^2 \theta$). The signal proportional to $\sin^3 \theta$ appears at the joined collectors of transistors 62, 72 and 64, 74 in push-pull relation. The magnitude of the signal proportional to $\sin^3 \theta$ is related to the gain of multiplier 50, which in turn is related to the value R of resistor 56 and the values of resistors 96, 97. In this case, the value of resistor 56 of multiplier 50 and the value of resistor 26 of multiplier 20 are substantially equal and the values of resistors 46, 47, 96, 97 are substantially equal to each other as noted above.

For purposes of convenience, multipliers 20 and 50 are assumed to exhibit unity signal gain. When the polarity of the input signal $A \sin \theta$ appearing at input terminal $T_1$ at a given point in time is positive relative to the polarity of the input signal $-A \sin \theta$ appearing at input terminal $T_2$, the signal proportional to $\sin^3 \theta$ appearing at the joined collectors of transistors 64 and 74 is defined by the expression $$\sin^3 \theta = \tfrac{3}{4} \sin \theta - \tfrac{1}{4} \sin 3\theta$$

Since the signal appearing at the joined collectors of transistors 64, 74 is in push-pull or antiphase relation with respect to the signal appearing at the joined collectors of transistors 62, 72, the latter signal is accordingly defined by the expression $$-\sin^3 \theta = -\tfrac{3}{4} \sin \theta + \tfrac{1}{4} \sin 3\theta$$

The push-pull signal developed by multiplier 50 therefore contains a desired third harmonic component proportional to $\sin 3\theta$, and an undesired first harmonic component proportional to $\sin \theta$. The undesired first harmonic component is cancelled by signal proportioning network 80 together with combining network 90 as follows.

Network 80 proportionally amplifies the push-pull signals of the form $\sin \theta$ which are applied to transistors 82 and 84 of network 80 from the collectors of transistors 14 and 12 of amplifier 10, relative to the manner in which the latter signals are amplified by multipliers 20 and 50. It is noted that the signals applied from amplifier 10 are of the form $\sin \theta$ and therefore are proportional to the first harmonic component $\tfrac{3}{4} \sin \theta$ of the signal $\sin^3 \theta$ noted above.

More specifically, the gain of network 80 is reduced by a factor of $\tfrac{3}{4}$ relative to the gains of multiplier 20 and multiplier 50. In this example, this is accomplished by biasing current source transistors 25, 55 and 85 from a similar source of bias potential (+), and by selecting the value of resistor 85 of network 80 to be $\tfrac{3}{4}$ of this value R of resistors 25 and 55 of multipliers 20 and 50. For input signals of the relative polarity mentioned previously, a signal $-\tfrac{3}{4} \sin \theta$ appears at the collector of transistor 82 and a signal $\tfrac{3}{4} \sin \theta$ appears at the collector of transistor 84.

When the signal $-\tfrac{3}{4} \sin \theta$ derived from network 80 is combined in resistor 96 with the signal $\sin^3 \theta$ appearing at the joined collectors of transistors 64 and 74, the undesired first harmonic component $\tfrac{3}{4} \sin \theta$ of the signal $\sin^3 \theta$ and the derived signal $-\tfrac{3}{4} \sin \theta$ cancel each other, so that only the desired third harmonic component of the signal $\sin^3 \theta$ remains. Similarly, when the signal $\tfrac{3}{4} \sin \theta$ as derived from network 80 is combined in resistor 97 with the signal $-\sin^3 \theta$ appearing at the joined collectors of transistors 62 and 72, the undesired first harmonic component $-\tfrac{3}{4} \sin \theta$ of the signal $-\sin^3 \theta$ and the derived signal $\tfrac{3}{4} \sin \theta$ cancel, so that only the desired harmonic component of the signal $-\sin^3 \theta$ remains. A push-pull third harmonic output signal $V_o$ proportional to sin 3θ is therefore provided at output terminals $T_3$ and $T_4$. FIG. 2 illustrates the relationships of the signals mentioned above.

It is noted that an input signal of the form cos Ωt (or cos θ) may also be employed to derive a third harmonic signal according to the present invention. In this case, depending upon the polarity of the input signal, a signal $$\cos^3 \theta = \tfrac{3}{4} \cos \theta + \tfrac{1}{4} \cos 3\theta$$

would appear at one of the joined collectors of transistors 64, 74 or 62, 72, and a signal $$-\cos^3 \theta = -\tfrac{3}{4} \cos \theta - \tfrac{1}{4} \cos 3\theta$$

would appear in push-pull or antiphase relation at the other of the joined collectors of transistors 64, 74 or 62, 72. A signal $-\tfrac{3}{4} \cos \theta$ and a signal $\tfrac{3}{4} \cos \theta$, as derived by network 80, would appear in push-pull relation at one and the other of the collectors of transistors 82 or 84. A desired third harmonic output signal proportional to cos θ would be provided in push-pull relation at output terminals $T_3$ and $T_4$, when the signals appearing at the joined collectors of transistors 64, 74 and 62, 72 are combined with the signals provided by network 80 to cancel the first harmonic component.

A third harmonic signal generator as described above does not require reactive circuit components and is particularly adapted to integrated circuit techniques. Integrated circuit techniques permit accurately proportioned resistances and matched signal multipliers to be provided.

Although the invention has been described in terms of a specific circuit embodiment, it should be appreciated that other arrangements may be devised by those skilled in the art without departing from the scope of the invention. For example, signals may be applied to and derived from the various stages of the disclosed circuit embodiment in single-end fashion. The gains of the various stages may be tailored to suit a particular circuit application, and active signal combining devices may be used in place of signal combining resistors 96 and 97. Also, a circuit employing the present invention may comprise either bipolar or MOS transistors or combinations of such devices.

What is claimed is:
1. A third harmonic signal generator comprising:
   means for providing an alternating input signal;
   signal multiplier means coupled to said input signal means, for providing a first output signal proportional to said input signal raised to the third power, said first output signal having a first harmonic component proportional to said input signal and having a third harmonic component proportional to said input signal;
   means responsive to said input signal for providing a second output signal in predetermined magnitude and polarity relation with said first harmonic component;
and
   means for combining said first and second output signals to cancel said first harmonic component and thereby provide a third output signal proportional to said third harmonic component and substantially devoid of said first harmonic component.
2. A signal generator according to claim 1, wherein said alternating input signal comprises a signal proportional to sin θ.
3. A signal generator according to claim 1, wherein said alternating input signal comprises a signal proportional to cos θ.
4. A signal generator according to claim 1, wherein said signal multiplier means comprises:
   first signal multiplier means having first and second inputs coupled to said signal means, for providing a signal proportional to said input signal raised to the second power at an output; and
   second multiplier means having a first input coupled to said input signal means and having a second input coupled to said output of said first signal multiplier means, for providing a signal proportional to said input signal raised to the third power at an output.
5. A signal generator according to claim 4, wherein:
   said input signal comprises a signal proportional to sin θ and said first signal multiplier means provides a signal proportional to $\sin^2 \theta$ at said output; and
   said second signal multiplier means provides a signal proportional to $\sin^3 \theta$ at said output, said signal $\sin^3 \theta$ having a first harmonic component proportional to sin θ and a third harmonic component proportional to sin 3θ.
6. A signal generator according to claim 4, wherein:
   said input signal comprises a signal proportional to cos θ and said first signal multiplier means provides a signal proportional to $\cos^2 \theta$ at said output; and
   said second signal multiplier means provides a signal proportional to $\cos^3 \theta$ at said output, said signal $\cos^3 \theta$ having a first harmonic component proportional to cos θ and a third harmonic component proportional to cos 3θ.
7. A signal generator according to claim 4, wherein:
   said first signal multiplier means and said second signal multiplier means each include gain proportioning means for determining the signal gains of said first and second signal multipliers to be substantially equal; and
   said means for providing said second signal includes gain proportioning means for determining the signal gain of said means for providing said second signal to be substantially equal to three-fourths of said signal gain of said first and second multiplier means.
8. A signal generator according to claim 7, wherein:
   said gain proportional means of said first and second signal multiplier means each comprise direct current coupling means of a predetermined resistance value R: and
   said gain proportioning means of said means for providing said second signal comprises direct current coupling means of a resistance value ¾ R.
9. A third harmonic signal generator circuit comprising:
   a source of alternating input signals proportional to sin θ;
   a first signal multiplier comprising a first amplifier having input and common electrodes coupled to said source, and an output electrode, for providing a first output signal proportional to $\sin^2 \theta$;
   a second signal multiplier comprising a second amplifier having an input electrode coupled to said out- put electrode of said first amplifier, a common electrode coupled to said source, and an output electrode, for providing a second output signal proportional to $\sin^3 \theta$ having a first harmonic component proportional to $\sin \theta$ and a third harmonic component proportional to $\sin 3\theta$;

a third amplifier having an input electrode coupled to said source, a common electrode and an output electrode, for providing a third output signal in predetermined magnitude and polarity relation with said first harmonic component $\sin \theta$; and a combining network coupled to said outputs of said second and third amplifiers, for combining said second and third output signals to cancel said first harmonic component of said second signal and thereby provide an output signal proportional to said third harmonic component $\sin 3\theta$ and substantially devoid of said first harmonic component.

10. A circuit according to claim 9, wherein said first and second amplifiers respectively include first and second current sources for determining the signal gains of said first and second amplifiers to be relatively equal, and wherein said third amplifier includes a third current source for determining the signal gain of said third amplifier such that said predetermined magnitude of said third output signal is established.

11. A circuit according to claim 10, wherein said first harmonic component exhibits a magnitude proportional to ¾ $\sin \theta$ and said third harmonic component exhibits a magnitude proportional to ¼ $\sin 3\theta$, relative to the magnitude of said second output signal $\sin^3 \theta$.

12. A circuit according to claim 11, wherein said third current source exhibits a current conduction of a magnitude substantially equal to three-fourths that of said first and second current sources.

13. A circuit according to claim 12, wherein said first and second current sources each comprise a resistance of a value R and said third current source comprises a resistance of a value substantially equal to ¾ R.

14. A circuit according to claim 13, wherein said source of input signals provides an input signal proportional to $\cos \theta$, so that said second signal multiplier provides a second output signal proportional to $\cos^3 \theta$ having a first harmonic component proportional to $\cos \theta$ and a third harmonic component proportional to $\cos 3\theta$, and said third amplifier provides a third output signal in predetermined magnitude and polarity relation with said first harmonic component $\cos \theta$.

15. A circuit according to claim 14, wherein said combining network comprises a resistance.

16. A circuit according to claim 15, wherein said first, second and third amplifiers comprise transistors each having base, collector and emitter electrodes respectively corresponding to said input, output and common electrodes.

* * * * *